US007804293B2

United States Patent
Hashimoto (10) Patent No.: US 7,804,293 B2
(45) Date of Patent: *Sep. 28, 2010

(54) POWER SUPPLY AND STABILIZER

(75) Inventor: Yoshihiro Hashimoto, Saitama (JP)

(73) Assignee: Advantest Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/267,621

(22) Filed: Nov. 10, 2008

(65) Prior Publication Data

US 2009/0289609 A1    Nov. 26, 2009

Related U.S. Application Data

(63) Continuation of application No. PCT/JP2007/059323, filed on May 1, 2007.

(30) Foreign Application Priority Data

Jun. 1, 2006    (JP)    ............... 2006-154076

(51) Int. Cl.
G01R 31/28    (2006.01)
(52) U.S. Cl. ................................... 324/158.1
(58) Field of Classification Search ............ 324/158.1, 324/765; 323/269, 243, 303
See application file for complete search history.

(56) References Cited

U.S. PATENT DOCUMENTS 3,353,080 A * 11/1967 Santelmann, Jr. .......... 323/268
5,594,359 A * 1/1997 Hashimoto ............... 324/158.1
7,005,867 B2 * 2/2006 Hashimoto ................ 324/713
7,132,844 B2 * 11/2006 Hashimoto ................ 324/765
7,162,652 B2 * 1/2007 Issa et al. .................. 324/763
7,330,024 B2 * 2/2008 Hashimoto ............... 324/158.1

FOREIGN PATENT DOCUMENTS

| JP | 5-56641 | 3/1993 |
|---|---|---|
| JP | 2004-347421 | 12/2004 |
| JP | 2006-105620 | 4/2006 |

* cited by examiner

*Primary Examiner*—Bao Q Vu
*Assistant Examiner*—Jue Zhang
(74) *Attorney, Agent, or Firm*—Jianq Chyun IP Office (57) ABSTRACT

Provided is a power supply apparatus including a low pass filter that receives an output voltage of a current output section and allows a low frequency component with a frequency lower than a preset cutoff frequency to pass through; an excess voltage restricting load section that consumes an excess voltage restricting current, which is at least a portion of the output current from the current output section, when a load is turned on; and an excess voltage restricting control section that keeps the excess voltage restricting load section turned off when the output voltage of the current output section is less than an upper reference voltage, which is obtained by adding together a voltage output by the low pass filter and a preset upper offset voltage.

13 Claims, 9 Drawing Sheets

POWER SUPPLY AND STABILIZER

CROSS REFERENCE TO RELATED APPLICATION

This is a continuation application of PCT/JP2007/059323 filed on May 1, 2007 which claims priority from a Japanese Patent Application No. 2006-154076 filed on Jun. 1, 2006, the contents of which are incorporated herein by reference.

BACKGROUND

1. Technical Field

The present invention relates to a power supply apparatus, a test apparatus, and a stabilizing apparatus. In particular, the present invention relates to a power supply apparatus, a test apparatus, and a stabilizing apparatus that supply an electronic device with a stabilized power supply voltage. The present patent application claims priority based on a Japanese Patent Application No. 2006-154076 filed on Jun. 1, 2006, the contents of which are incorporated herein by reference.

2. Related Art

A test apparatus that tests an electronic device desirably supplies the electronic device with a power supply voltage having as little fluctuation as possible, even if the current consumed by the electronic device fluctuates greatly. Japanese Patent Application Publication No. 2004-347421 and Japanese Patent Application Publication No. 2006-105620 each disclose a power supply apparatus that is provided with load sections connected in parallel to the power supply output terminal and that prevents a decrease in the power supply voltage when the power supply current is increased, by stopping the current consumption by the parallel load sections.

The power supply apparatuses described above, however, have difficulty stabilizing the power supply voltage if the decrease in the power supply current supplied to the electronic device is accompanied by an increase in the power supply voltage.

SUMMARY

Therefore, it is an object of an aspect of the innovations herein to provide a power supply apparatus, a test apparatus, and a stabilizing apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary power supply apparatus may include a power supply apparatus that supplies a power supply current to an electronic device, including a current output section that outputs an output current that includes the power supply current; a low pass filter that receives an output voltage of the current output section and allows a low frequency component with a frequency lower than a preset cutoff frequency to pass through; an excess voltage restricting load section that is connected between the current output section and a ground, in parallel with the electronic device, and that consumes an excess voltage restricting current, which is at least a portion of the output current from the current output section, when a load is turned on and stops the consumption of the excess voltage restricting current when the load is turned off; and an excess voltage restricting load control section that keeps the excess voltage restricting load section turned off when the output voltage of the current output section is less than an upper reference voltage, which is obtained by adding together a voltage output by the low pass filter and a preset upper offset voltage, and that turns on the excess voltage restricting load section when the output voltage becomes greater than or equal to the upper reference voltage.

According to a second aspect related to the innovations herein, one exemplary test apparatus may include a test apparatus that tests an electronic device, including a current output section that outputs an output current that includes a power supply current supplied to the electronic device; a low pass filter that receives an output voltage of the current output section and allows a low frequency component with a frequency lower than a preset cutoff frequency to pass through; an excess voltage restricting load section that is connected between the current output section and a ground, in parallel with the electronic device, and that consumes an excess voltage restricting current, which is at least a portion of the output current from the current output section, when a load is turned on and stops the consumption of the excess voltage restricting current when the load is turned off; an excess voltage restricting control section that keeps the excess voltage restricting load section turned off when the output voltage of the current output section is less than an upper reference voltage, which is obtained by adding together a voltage output by the low pass filter and a preset upper offset voltage, and that turns on the excess voltage restricting load section when the output voltage is greater than or equal to the upper reference voltage; a current measuring section that measures the power supply current supplied to the electronic device; and a judging section that judges whether the electronic device is defective based on a result of the measurement by the current measuring section.

According to a third aspect related to the innovations herein, one exemplary stabilizing apparatus may include a stabilizing apparatus equipped in a current output apparatus that supplies an output current to an electronic device as a power supply current, including a low pass filter that receives an output voltage of the current output apparatus and allows a low frequency component with a frequency lower than a preset cutoff frequency to pass through; an excess voltage restricting load section that is connected between the current output apparatus and a ground, in parallel with the electronic device, and that consumes an excess voltage restricting current, which is at least a portion of the output current from the current output apparatus, when a load is turned on and stops the consumption of the excess voltage restricting current when the load is turned off; and an excess voltage restricting control section that keeps the excess voltage restricting load section turned off when the output voltage of the current output apparatus is less than an upper reference voltage, which is obtained by adding together a voltage output by the low pass filter and a preset upper offset voltage, and that turns on the excess voltage restricting load section when the output voltage becomes greater than or equal to the upper reference voltage.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 3 shows exemplary currents and voltages, where (A) shows examples of the output current $I_{DD}$ supplied to the power supply input terminal of the electronic device 100 and the power supply current $I_{DPS}$ output from the current output section 30, (B) shows an example of a first load current $I_{DL}$ flowing through the voltage drop compensation load section 42, (C) shows an example of a second load current $I_{DH}$ flowing through the excess voltage restricting load section 44, (D) shows an example of the output voltage $V_{OUT}$ applied to the power supply input terminal of the electronic device 100, (E) shows an example of the cutoff control signal $S_1$ that switches the cutoff frequency of the low pass filter 38, and (F) shows an example of the reference voltage $V_{REF}$ output from the low pass filter 38.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
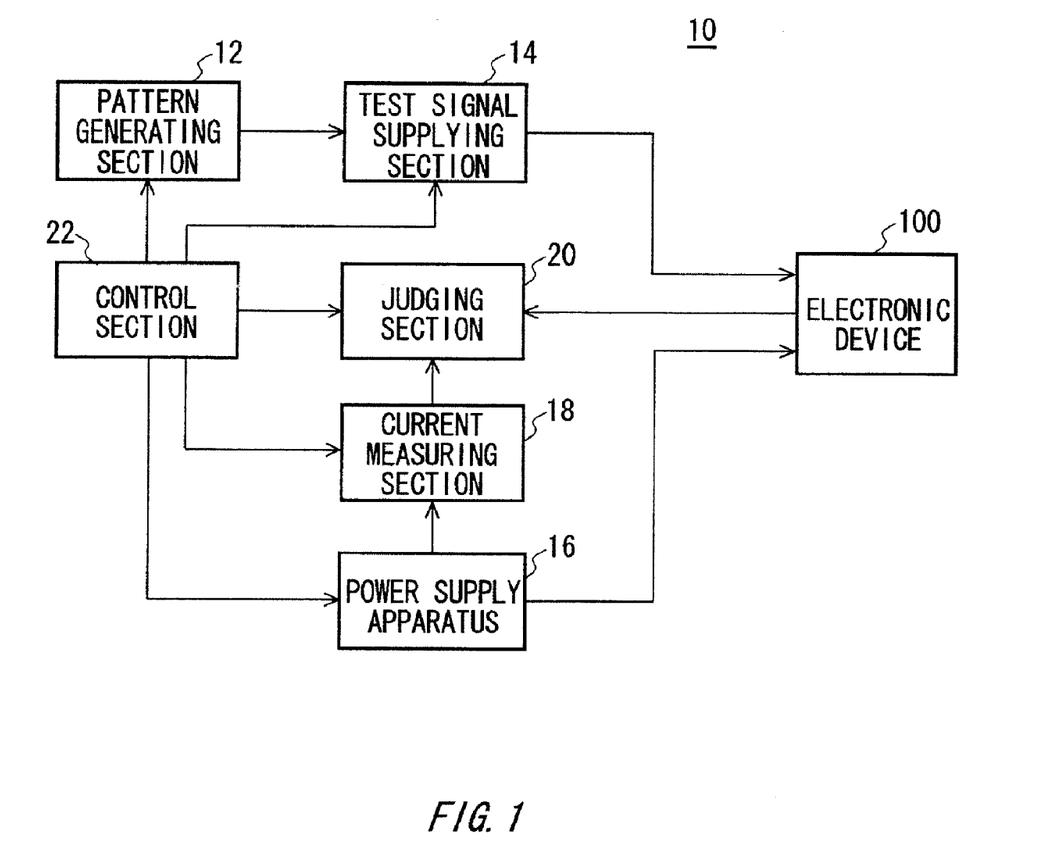
FIG. 1 shows a configuration of a test apparatus 10 according to an embodiment of the present invention, together with an electronic device 100.

FIG. 1 shows a configuration of a test apparatus 10 according to an embodiment of the present invention, together with an electronic device 100. The test apparatus 10 tests the electronic device 100, which is a device under test. The test apparatus 10 includes a pattern generating section 12, a test signal supplying section 14, a power supply apparatus 16, a power supply measuring section 18, a judging section 20, and a control section 22.

The pattern generating section 12 generates a test pattern indicating the pattern of a test signal to be supplied to the electronic device 100. The test signal supplying section 14 supplies the electronic device 100 with the test signal corresponding to the test pattern generated by the pattern generating section 12. The power supply apparatus 16 supplies a power supply voltage to a power supply input terminal of the electronic device 100. The power supply measuring section 18 measures a power supply current supplied to the power supply input terminal of the electronic device 100. The judging section 20 judges the acceptability of a signal output by the electronic device 100 in response to the test signal. In addition, the judging section 20 judges whether the electronic device 100 is defective based on the measurement result of the power supply measuring section. The control section 22 controls the pattern generating section 12, the test signal supplying section 14, the power supply apparatus 16, the power supply measuring section 18, and the judging section 20.

Figure 2:
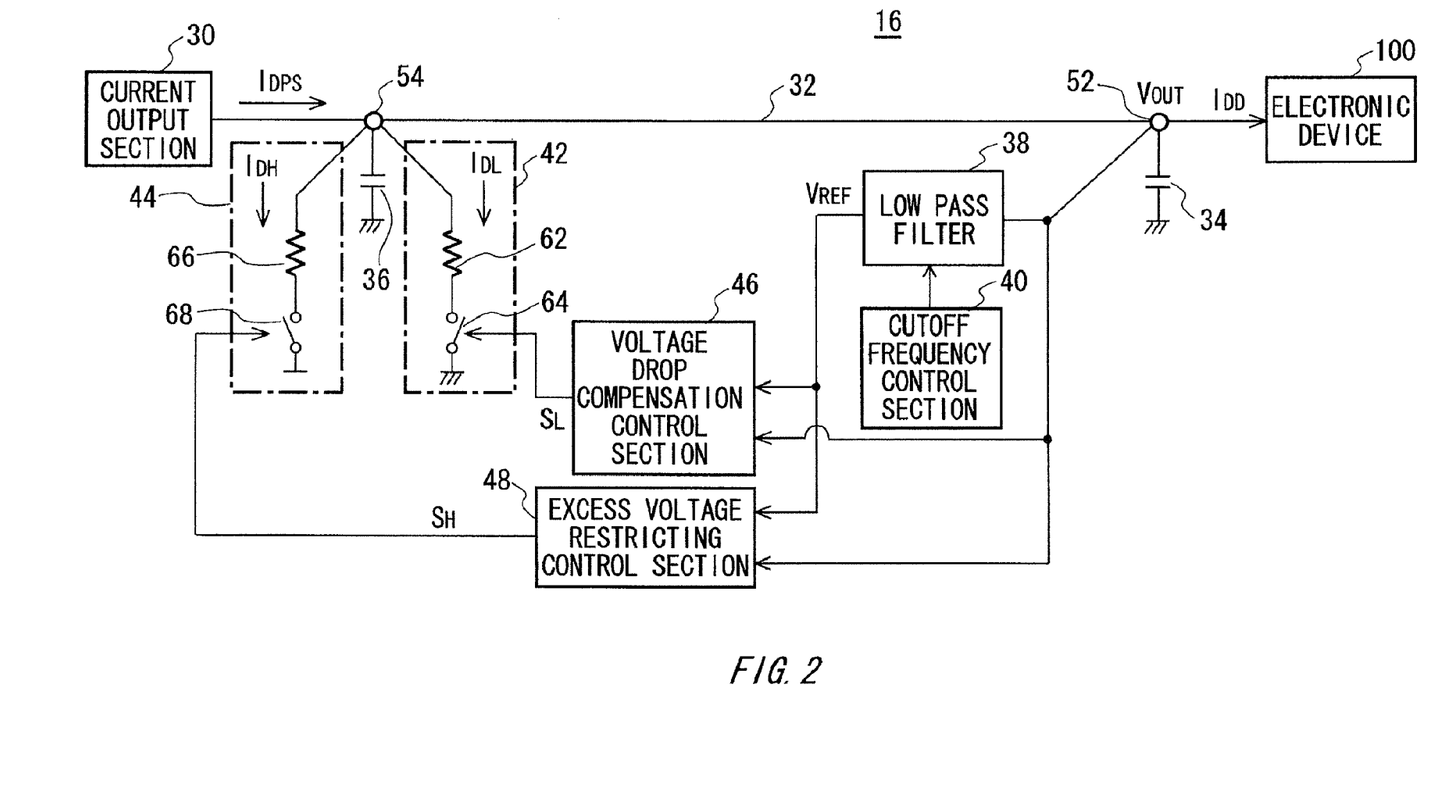
FIG. 2 shows a configuration of the power supply apparatus 16 of the present embodiment together with the electronic device 100.

FIG. 2 shows a configuration of the power supply apparatus 16 of the present embodiment together with the electronic device 100. The power supply apparatus 16 includes a current output section 30, a power supply line 32, a device-side capacitor 34, a power supply-side capacitor 36, a low pass filter 38, a cutoff frequency control section 40, a voltage drop compensation load section 42, an excess voltage restricting load section 44, a voltage drop compensation control section 46, and an excess voltage restricting control section 48. The test apparatus 10 may include the power supply line 32, the device-side capacitor 34, the power supply-side capacitor 36, the low pass filter 38, the cutoff frequency control section 40, the voltage drop compensation load section 42, the excess voltage restricting load section 44, the voltage drop compensation control section 46, and the excess voltage restricting control section 48 on a performance board on which the electronic device 100 is also mounted, for example. In this way, the test apparatus 10 can form a stabilizing apparatus on the performance board that can stabilize the power supply voltage supplied to the electronic device 100.

The current output section 30 outputs an output current $I_{DPS}$ that includes a power supply current $I_{DD}$ supplied to the electronic device 100. The power supply line 32 provides a connection between the output of the current output section 30 and the power supply input terminal of the electronic device 100.

The device-side capacitor 34 is connected in parallel with the electronic device 100, and provided between a ground and a junction 52. The junction 52 is between the output of the current output section 30 and the power supply input terminal of the electronic device 100. The device-side capacitor 34 smoothes the power supply voltage supplied to the power supply input terminal of the electronic device 100. The device-side capacitor 34 may be provided near the electronic device 100. The power supply-side capacitor 36 is provided between the ground and a branching point 54. The branching point 54 is between (i) the junction 52 between the device-side capacitor 34 and the power supply line 32 and (ii) the output of the current output section 30. In other words, the power supply-side capacitor 36 is provided on the power supply line 32 closer to the current output section 30 than the device-side capacitor 34. The power supply-side capacitor 36 smoothes the power supply voltage supplied to the power supply input terminal of the electronic device 100.

The low pass filter 38 receives the output voltage $V_{OUT}$ from the current output section 30, allows a low frequency component lower than a preset cutoff frequency to pass through, and outputs the resulting voltage as the reference voltage $V_{REF}$. The low pass filter 38 may receive the output voltage $V_{OUT}$ from the low pass filter 38 near the electronic device 100 by receiving the voltage between the terminals of the device-side capacitor 34. When the reference value of the output current $I_{DPS}$ from the current output section 30 changes, the cutoff frequency control section 40 sets the cutoff frequency of the low pass filter 38 to be higher while the output current of the current output section 30 reaches a new reference value and sets the cutoff frequency back to normal after the output current has reached the new reference value. For example, the cutoff frequency control section 40 increases the cutoff frequency of the low pass filter 38 at a time when the electronic device 100 begins being supplied with the power supply voltage, and decreases the cutoff frequency of the low pass filter 38 after the charging of the device-side capacitor 34 and the power supply-side capacitor 36 has been completed.

The voltage drop compensation load section 42 is connected between the ground and the output of the current output section 30, in parallel with the electronic device 100. When the load is turned on, the voltage drop compensation load section 42 consumes a voltage drop compensation current $I_{DL}$, which is at least a portion of the output current $I_{DPS}$ from the current output section 30. When the load is turned off, the voltage drop compensation load section 42 stops consuming the voltage drop compensation current $I_{DL}$. In the present embodiment, the voltage drop compensation load section 42 includes (i) a first resistance 62 provided between the ground and the output of the current output section 30 and (ii) a first switch 64 that switches whether a connection is provided between the first resistance 62 and the ground. When the load is turned on, the first switch 64 connects the first resistance 62 to the ground so that the voltage drop compensation current $I_{DL}$ flows to the first resistance 62. When the load is turned off, the first switch 64 disconnects the first resistance 62 from the ground so that the voltage drop compensation current $I_{DL}$ stops flowing to the first resistance 62. Instead of switching a connection between the first resistance 62 and the ground, the first switch 64 may switch a connection between the first resistance 62 and the current output section 30.

The voltage drop compensation load section 42 may be connected between (i) the ground and (ii) a line between the branching point 54 and the power supply-side capacitor 36. In this way, even if a voltage spike is caused by switching the voltage drop compensation load section 42, the power supply-side capacitor 36 can absorb more of the voltage spike to stabilize the power supply voltage supplied to the electronic device 100.

The excess voltage restricting load section 44 is provided between the current output section 30 and the ground, in parallel with the electronic device 100 and the voltage drop compensation load section 42. When the load is turned on, the excess voltage restricting load section 44 consumes an excess voltage restricting current $I_{DH}$, which is at least a portion of the output current from the current output section 30. When the load is turned off, the excess voltage restricting load section 44 stops consuming the excess voltage restricting current $I_{DH}$. In the present embodiment, the excess voltage restricting load section 44 includes (i) a second resistance 66 provided between the ground and the output of the current output section 30 and (ii) a second switch 68 that switches whether a connection is provided between the second resistance 66 and the ground. When the load is turned on, the second switch 68 connects the second resistance 66 to the ground so that the excess voltage restricting current $I_{DH}$ flows to the second resistance 66. When the load is turned off, the second switch 68 disconnects the second resistance 66 from the ground so that the excess voltage restricting current $I_{DH}$ stops flowing to the second resistance 66. Instead of switching a connection between the second resistance 66 and the ground, the second switch 68 may switch a connection between the second resistance 66 and the current output section 30.

The excess voltage restricting load section 44 may be connected between (i) the ground and (ii) a line between the branching point 54 and the power supply-side capacitor 36. In this way, even if the a voltage spike is caused by switching the excess voltage restricting load section 44, the power supply-side capacitor 36 can absorb more of the voltage spike to stabilize the power supply voltage supplied to the electronic device 100.

The voltage drop compensation control section 46 keeps the voltage drop compensation load section 42 turned on when the output voltage $V_{OUT}$ of the current output section 30 is greater than or equal to a lower reference voltage $V_{ref1}$ obtained by subtracting a preset lower offset voltage from the reference voltage output by the low pass filter 38. The voltage drop compensation control section 46 turns off the voltage drop compensation load section 42 when the output voltage $V_{OUT}$ is less than the lower reference voltage $V_{ref1}$. The voltage drop compensation control section 46 of the present embodiment outputs a first load control signal $S_L$ that turns on the first switch 64 when the output voltage $V_{OUT}$ is greater than or equal to the lower reference voltage $V_{ref1}$, and turns off the first switch 64 when the output voltage $V_{OUT}$ is less than the lower reference voltage $V_{ref1}$.

The excess voltage restricting control section 48 keeps the excess voltage restricting load section 44 turned off when the output voltage $V_{OUT}$ of the current output section 30 is less than an upper reference voltage $V_{ref2}$ obtained by adding a preset upper offset voltage to the reference voltage output by the low pass filter 38. The excess voltage restricting control section 48 turns on the excess voltage restricting load section 44 when the output voltage $V_{OUT}$ is greater than or equal to the upper reference voltage $V_{ref2}$. The excess voltage restricting control section 48 of the present embodiment outputs a second load control signal $S_H$ that turns off the second switch 68 when the output voltage $V_{OUT}$ is less than the upper reference voltage $V_{ref2}$ and turns on the second switch 68 when the output voltage $V_{OUT}$ is greater than or equal to the upper reference voltage $V_{ref2}$.

Figure 3:
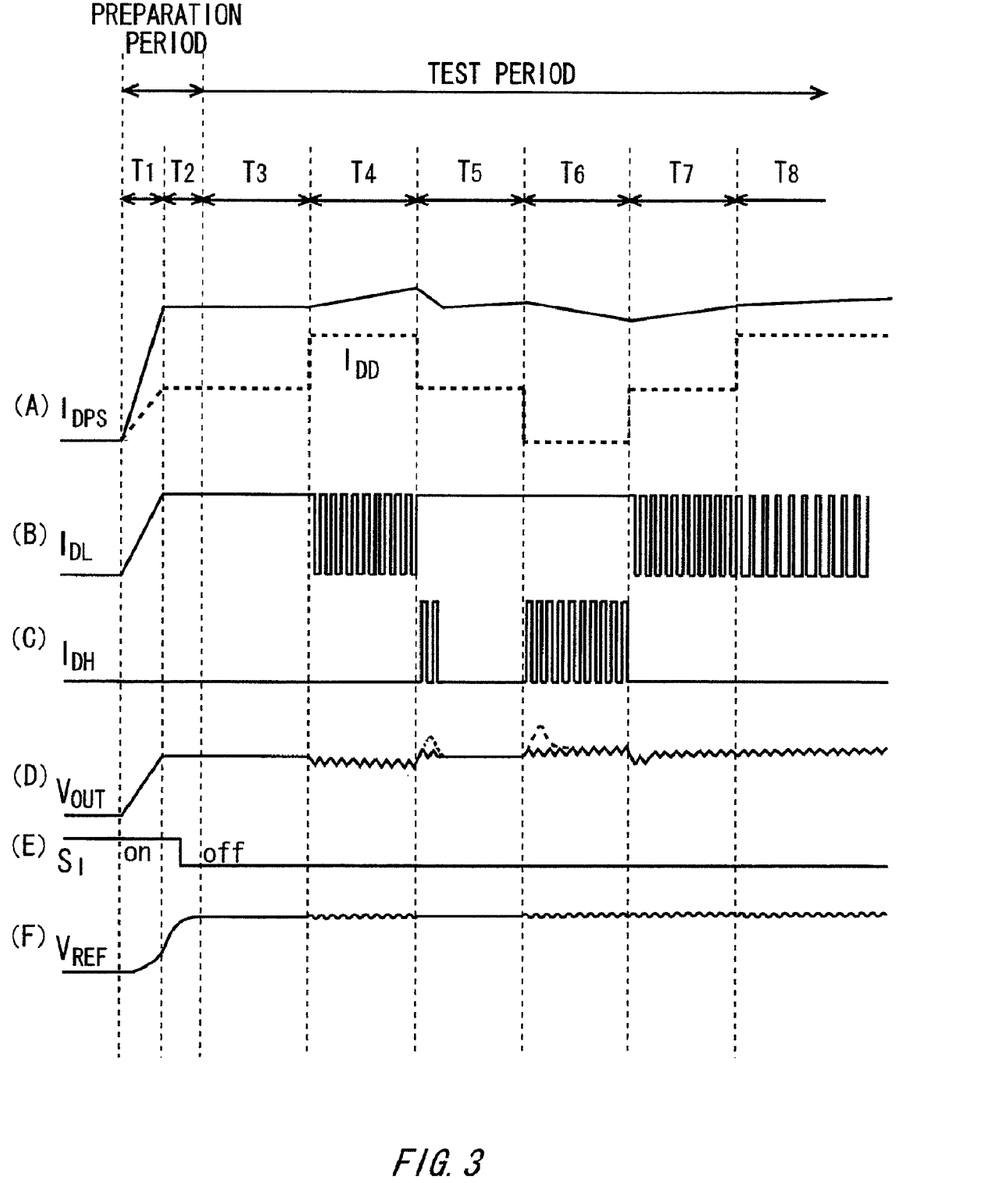

In FIG. 3, (A) shows examples of the output current $I_{DD}$ supplied to the power supply input terminal of the electronic device 100 and the power supply current $I_{DPS}$ output from the current output section 30, (B) shows an example of a first load current $I_{DL}$ flowing through the voltage drop compensation load section 42, (C) shows an example of a second load current $I_{DH}$ flowing through the excess voltage restricting load section 44, (D) shows an example of the output voltage $V_{OUT}$ applied to the power supply input terminal of the electronic device 100, (E) shows an example of the cutoff control signal $S_1$ that switches the cutoff frequency of the low pass filter 38, and (F) shows an example of the reference voltage $V_{REF}$ output from the low pass filter 38. The dotted line portion of (D) at intervals $T_5$ and $T_6$ shows an example of the output voltage $V_{OUT}$ obtained when the power supply apparatus 16 is not provided with the excess voltage restricting load section 44 and the excess voltage restricting control section 48.

When the power supply apparatus 16 begins operating, the current output section 30 begins supplying the output voltage and the cutoff frequency control section 40 sets the cutoff frequency of the low pass filter 38 to be higher than the cutoff frequency during testing. During the interval $T_1$, which is immediately after the power supply apparatus 16 begins operating, the device-side capacitor 34 and the power supply-side capacitor 36 are charged with the output current $I_{DPS}$ from the current output section 30. Accordingly, during the interval $T_1$, the output voltage $V_{OUT}$ increases linearly and the power supply current $I_{DD}$ also increases linearly according to the increase of the output voltage $V_{DD}$.

Since the output voltage $V_{OUT}$ becomes higher than the reference voltage $V_{REF}$ while the output voltage $V_{OUT}$ increases, i.e. since the output voltage $V_{OUT}$ has a value greater than or equal to the lower reference voltage $V_{ref1}$, the voltage drop compensation control section 46 keeps the voltage drop compensation load section 42 turned on during the interval $T_1$. Accordingly, during the interval $T_1$, the voltage drop compensation current $I_{DL}$ increases proportionally with the output voltage $V_{OUT}$. Even when the output voltage $V_{OUT}$ increases beyond the reference voltage $V_{REF}$, the output voltage $V_{OUT}$ does not become greater than or equal to the upper offset voltage because the rate of increase of the output voltage $V_{OUT}$ is relatively low at the beginning of operation. Accordingly, the voltage drop compensation control section 46 turns off the excess voltage restricting load section 44 to stop the consumption of the excess voltage restricting current $I_{DH}$ by the excess voltage restricting load section 44. When changing the output voltage of the current output section 30 to a prescribed voltage, the excess voltage restricting control section 48 may control the excess voltage restricting load section 44 to be turned off until the output voltage $V_{OUT}$ reaches the prescribed voltage. As a result, the output current $I_{DPS}$ increases linearly during the interval $T_1$.

During the interval $T_2$, which is after charging of the device-side capacitor 34 and the power supply-side capacitor 36 is completed, the output voltage $V_{OUT}$, the voltage drop compensation current $I_{DL}$, the excess voltage restricting current $I_{DH}$, and the power supply current $I_{DD}$ all stabilize at a constant value. The low pass filter 38 outputs the reference voltage $V_{REF}$, which increases more slowly than the output voltage $V_{OUT}$. Accordingly, the reference voltage $V_{REF}$ stabilizes at a constant value at a time later than the time at which the charging of the device-side capacitor 34 and the power supply-side capacitor 36 is completed. The test apparatus 10 can begin testing the electronic device 100 at the interval $T_3$, which begins after the charging of the device-side capacitor 34 and the power supply-side capacitor 36 is completed and the reference voltage $V_{REF}$ stabilizes at the prescribed value.

Here, after the reference voltage $V_{REF}$ stabilizes at the prescribed value, the cutoff frequency control section 40 sets the cutoff frequency of the low pass filter 38 to a lower frequency. In this way, the cutoff frequency control section 40 can output a stabilized reference voltage $V_{REF}$ during testing, even if the output voltage $V_{OUT}$ fluctuates quickly, and can quickly increase the reference voltage $V_{REF}$ to the prescribed value before beginning operation, thereby shortening the time necessary before the testing can begin. The cutoff frequency control section 40 may set the lower cutoff frequency after a prescribed time has passed from when fluctuation in the voltage output by the current output section 30 begins, or may detect the reference voltage $V_{REF}$ and set the lower cutoff frequency according to whether the reference voltage $V_{REF}$ has reached the prescribed value.

When the power supply current $I_{DD}$ supplied to the electronic device 100 is stable during testing, i.e. the interval $T_3$, the output voltage $V_{OUT}$ is stabilized at a constant value. Since the output voltage $V_{OUT}$ and the reference voltage $V_{REF}$ are substantially equal during the interval $T_3$, i.e. since the output voltage $V_{OUT}$ is greater than the lower reference voltage $V_{ref1}$, the voltage drop compensation control section 46 keeps the voltage drop compensation load section 42 turned on during the interval $T_3$. Accordingly, during the interval $T_3$, the voltage drop compensation load section 42 consumes the voltage drop compensation current $I_{DL}$. Since the output voltage $V_{OUT}$ is less than the upper reference voltage $V_{ref2}$ during the interval $T_3$, the excess voltage restricting control section 48 keeps the excess voltage restricting load section 44 turned off during the interval $T_3$. Accordingly, during the interval $T_3$, the excess voltage restricting load section 44 does not consume the excess voltage restricting current $I_{DH}$.

When the power supply current $I_{DD}$ supplied to the electronic device 100 increases during testing, i.e. the intervals $T_4$, $T_7$, and $T_8$, the output voltage $V_{OUT}$ decreases because the supply of the output current $I_{DPS}$ by the current output section 30 is delayed. If the output voltage $V_{OUT}$ decreases quickly, the output voltage $V_{OUT}$ becomes lower than the reference voltage $V_{REF}$ by an amount greater than or equal to the lower offset voltage, i.e. the output voltage $V_{OUT}$ becomes less than the lower reference voltage $V_{ref1}$, and therefore the voltage drop compensation control section 46 turns off the voltage drop compensation load section 42. When the voltage drop compensation load section 42 is turned off, the voltage drop compensation current $I_{DL}$ consumed by the voltage drop compensation load section 42 is added to the output current $I_{DPS}$, which is supplied to the electronic device 100, so that the output voltage $V_{OUT}$ increases. When the output voltage $V_{OUT}$ increases, the output voltage $V_{OUT}$ becomes greater than or equal to the lower reference voltage $V_{ref1}$, and therefore the voltage drop compensation control section 46 turns on the voltage drop compensation load section 42. If the supply of the output current $I_{DPS}$ by the current output section 30 is still delayed after the voltage drop compensation load section 42 is turned on, the output voltage $V_{OUT}$ is less than the lower reference voltage $V_{ref1}$, and therefore the voltage drop compensation control section 46 turns off the voltage drop compensation load section 42.

The voltage drop compensation control section 46 repeatedly turns the voltage drop compensation load section 42 on and off to increase and decrease the output voltage $V_{OUT}$ until the current output section 30 outputs the output current $I_{DPS}$ that is increased by an amount equal to the increase of the power supply current $I_{DD}$. In this way, the power supply apparatus 16 can hold the output voltage $V_{OUT}$ at a substantially constant value, even when the power supply current $I_{DD}$ supplied to the electronic device 100 increases, as shown in the intervals $T_4$, $T_7$, and $T_8$.

When the power supply current $I_{DD}$ supplied to the electronic device 100 decreases during testing, i.e. the intervals $T_5$ and $T_6$, the output voltage $V_{OUT}$ increases because the supply (absorption) of the output current $I_{DPS}$ by the current output section 30 is delayed. If the output voltage $V_{OUT}$ increases quickly, the output voltage $V_{OUT}$ becomes greater than the reference voltage $V_{REF}$ by an amount greater than or equal to the upper offset voltage, i.e. the output voltage $V_{OUT}$ becomes greater than or equal to the upper reference voltage $V_{ref2}$, and therefore the excess voltage restricting control section 48 turns on the excess voltage restricting load section 44. When the excess voltage restricting load section 44 is turned on, the excess voltage restricting current $I_{DH}$ consumed by the excess voltage restricting load section 44 is removed from the output current $I_{DPS}$, which is supplied to the electronic device 100, so that the output voltage $V_{OUT}$ decreases. When the output voltage $V_{OUT}$ decreases, the output voltage $V_{OUT}$ becomes less than the upper reference voltage $V_{ref2}$, and therefore the excess voltage restricting control section 48 turns off the excess voltage restricting load section 44. If the absorption of the output current $I_{DPS}$ by the current output section 30 is still delayed after the excess voltage restricting load section 44 is turned off, the output voltage $V_{OUT}$ is greater than or equal to the upper reference voltage $V_{ref2}$, and therefore the excess voltage restricting control section 48 turns on the excess voltage restricting load section 44.

The voltage drop compensation control section 46 repeatedly turns the excess voltage restricting load section 44 off and on to decrease and increase the output voltage $V_{OUT}$ until the current output section 30 outputs the output current $I_{DPS}$ that is decreased by an amount equal to the decrease of the power supply current $I_{DD}$. In this way, the power supply apparatus 16 can hold the output voltage $V_{OUT}$ at a substantially constant value, even when the power supply current $I_{DD}$ supplied to the electronic device 100 increases, as shown in the intervals $T_5$ and $T_6$.

The power supply apparatus 16 described above can supply the electronic device 100 with a stabilized output voltage $V_{OUT}$ that does not increase even if the power supply current $I_{DD}$ supplied to the electronic device 100 decreases and that does not decrease even if the power supply current $I_{DD}$ supplied to the electronic device 100 increases. Therefore, the power supply apparatus 16 provided with such a power supply apparatus 16 can accurately test the electronic device 100.

Figure 4:
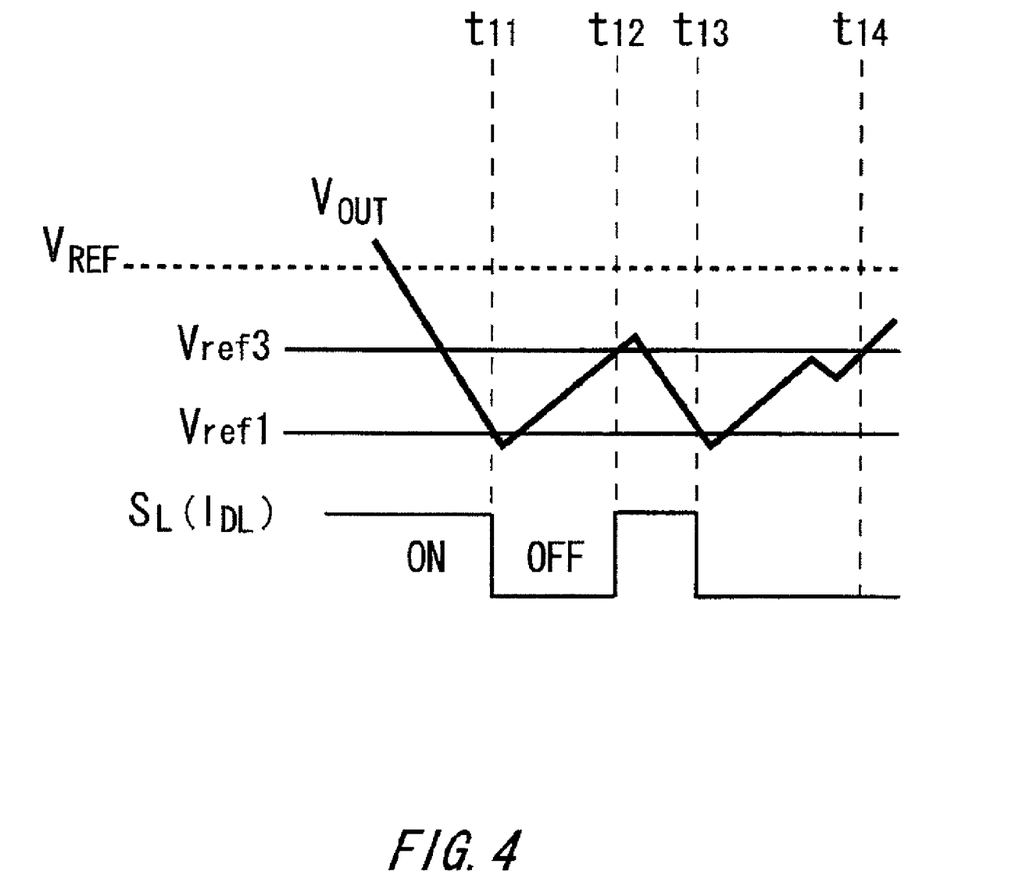
FIG. 4 shows an example of the switching timing of the first load control signal $S_L$ when a hysteresis is set for the reference voltage.

FIG. 4 shows an example of the switching timing of the first load control signal $S_L$ when a hysteresis is set for the reference voltage. The voltage drop compensation control section 46 keeps the voltage drop compensation load section 42 turned off until the output voltage $V_{OUT}$ becomes greater than or equal to a third reference voltage $V_{ref3}$, which is a voltage obtained by subtracting (i) a third preset offset voltage that is less than the lower offset voltage from (ii) the reference voltage $V_{REF}$ output from the low pass filter 38. When the output voltage $V_{OUT}$ becomes greater than or equal to the third reference voltage $V_{ref3}$, the voltage drop compensation control section 46 may turn on the voltage drop compensation load section 42.

For example, when the voltage drop compensation load section 42 is turned on so that the output voltage $V_{OUT}$ decreases to be less than the lower reference voltage $V_{ref1}$, as shown at times $t_{11}$ and $t_{13}$ in FIG. 4, the voltage drop compensation control section 46 switches the voltage drop compensation load section 42 from on to off. When the voltage drop compensation load section 42 is turned off so that the output voltage $V_{OUT}$ increases to be greater than or equal to the third reference voltage $V_{ref3}$, which is greater than the lower reference voltage $V_{ref1}$, as shown at times $t_{12}$ and $t_{14}$ in FIG. 4, the voltage drop compensation control section 46 switches the voltage drop compensation load section 42 from off to on.

Causing the voltage drop compensation control section 46 to apply a hysteresis to the threshold values in this way enables the on/off switching period of the voltage drop compensation load section 42 to be longer than if the hysteresis is not applied. As a result, the voltage drop compensation control section 46 causes the switching to be less frequent, which decreases the noise or the like generated by the switching of the voltage drop compensation load section 42.

Figure 5:
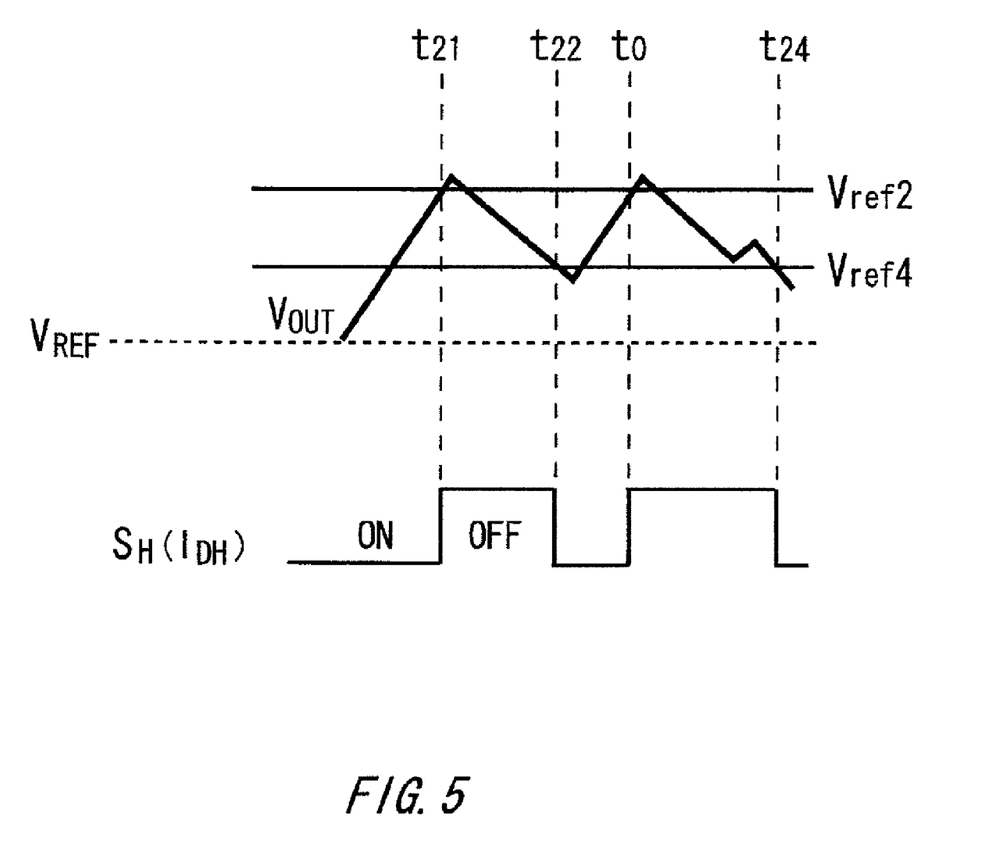
FIG. 5 shows an example of the switching timing of the second load control signal $S_H$ when a hysteresis is set for the reference voltage.

FIG. 5 shows an example of the switching timing of the second load control signal $S_H$ when a hysteresis is set for the reference voltage. The excess voltage restricting control section 48 keeps the excess voltage restricting load section 44 turned on until the output voltage $V_{OUT}$ becomes less than a fourth reference voltage $V_{ref4}$, which is a voltage obtained by adding (i) a fourth preset offset voltage that is less than the upper offset voltage to (ii) the reference voltage $V_{REF}$ output from the low pass filter 38. When the output voltage $V_{OUT}$ becomes less than the fourth reference voltage $V_{ref4}$, the excess voltage restricting control section 48 may turn off the excess voltage restricting load section 44.

For example, when the excess voltage restricting load section 44 is turned off so that the output voltage $V_{OUT}$ increases to be greater than or equal to the upper reference voltage $V_{ref2}$, as shown at times $t_{21}$ and $t_{23}$ in FIG. 5, the excess voltage restricting control section 48 switches the excess voltage restricting load section 44 from off to on. When the excess voltage restricting load section 44 is turned on so that the output voltage $V_{OUT}$ decreases to be less than the fourth reference voltage $V_{ref4}$, which is less than the upper reference voltage $V_{ref4}$, as shown at times $t_{22}$ and $t_{24}$ in FIG. 5, the excess voltage restricting control section 48 switches the excess voltage restricting load section 44 from on to off.

Causing the excess voltage restricting control section 48 to apply a hysteresis to the threshold values in this way enables the off/on switching period of the excess voltage restricting load section 44 to be longer than if the hysteresis is not applied. As a result, the excess voltage restricting control section 48 causes the switching to be less frequent, which decreases the noise or the like generated by the switching of the excess voltage restricting load section 44.

Figure 6:
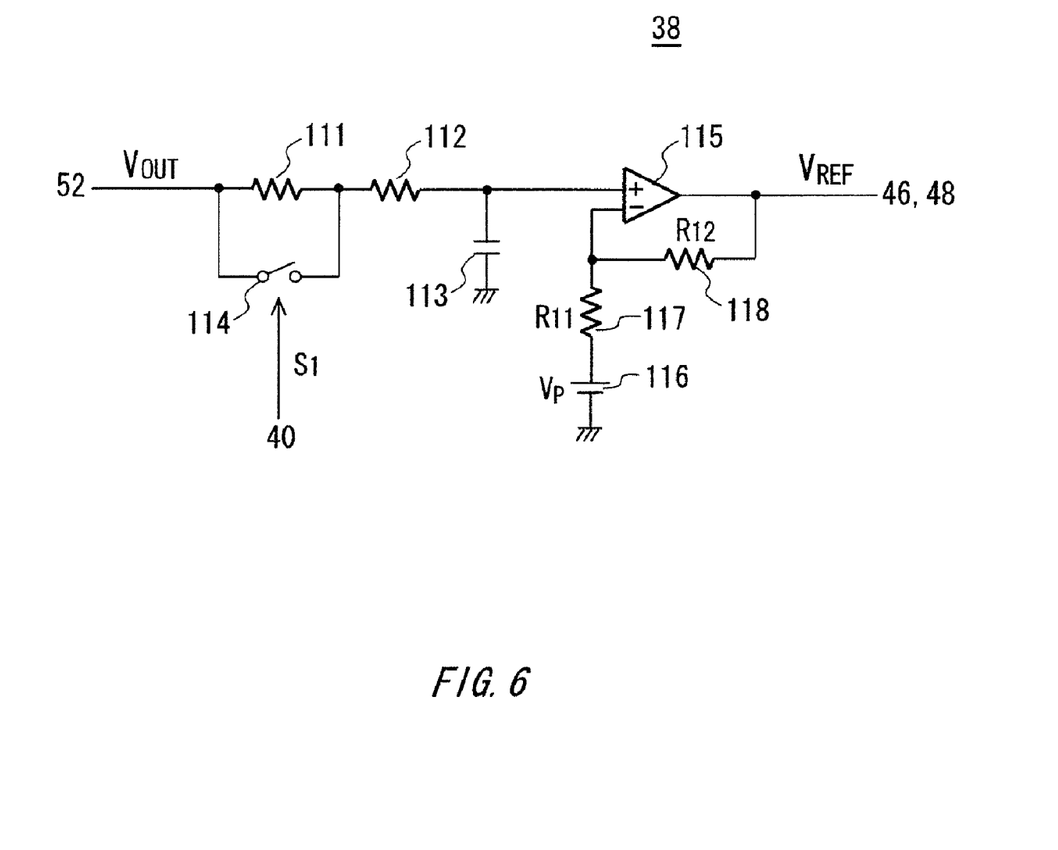
FIG. 6 shows an exemplary configuration of the low pass filter 38 according tot the present embodiment.

FIG. 6 shows an exemplary configuration of the low pass filter 38 according to the present embodiment. The low pass filter 38 may include a first filter resistance 111, a second filter resistance 112, a filter capacitor 113, a filter switch 114, a filter operational amplifier 115, a filter voltage source 116, a third filter resistance 117, and a fourth filter resistance 118.

The first filter resistance 111 and the second filter resistance 112 are connected in series between the junction 52 and a non-inverted input terminal of the filter operational amplifier 115. The filter capacitor 113 is provided between the non-inverted input terminal of the filter operational amplifier 115 and the ground. The filter switch 114 switches whether a connection is made between the ends of the first filter resistance 111 according to the cutoff control signal $S_1$ output from the cutoff frequency control section 40.

A negative terminal of the filter voltage source 116 is connected to the ground. The third filter resistance 117 is provided between the non-inverted input terminal of the filter operational amplifier 115 and a positive terminal of the filter voltage source 116. The fourth filter resistance 118 is provided between the output terminal of the filter operational amplifier 115 and the non-inverted input terminal of the filter operational amplifier 115.

The low pass filter 38 with the configuration described above can generate the reference voltage $V_{REF}$ obtained by passing the low frequency component of the output voltage $V_{OUT}$ generated at the junction 52, that is, the voltage $V_{REF}$ from which the high frequency component is eliminated. Furthermore, by using the low pass filter 38, the filter time constant can be switched according to the cutoff control signal $S_1$. More specifically, the low pass filter 38 has a higher cutoff frequency when the filter switch 114 is connected and has a lower cutoff frequency when the filter switch 114 is not connected.

The low pass filter 38 enables output of the reference voltage $V_{REF}$ to which the offset voltage is added. More specifically, if the voltage generated by the filter voltage source 116 is $V_P$, the resistance value of the third filter resistance 117 is $R_{11}$, and the resistance value of the fourth filter resistance 118 is $R_{12}$, the low pass filter 38 can output the reference voltage $V_{REF}$ shown below in Expression 1.

$$V_{REF}=(((R_{11}+R_{12})/R_{11})\times V_{OUT})-((R_{12}/R_{11})\times V_P) \quad \text{Expression 1}$$

Note that $V_P > V_{OUT}$

Figure 7:
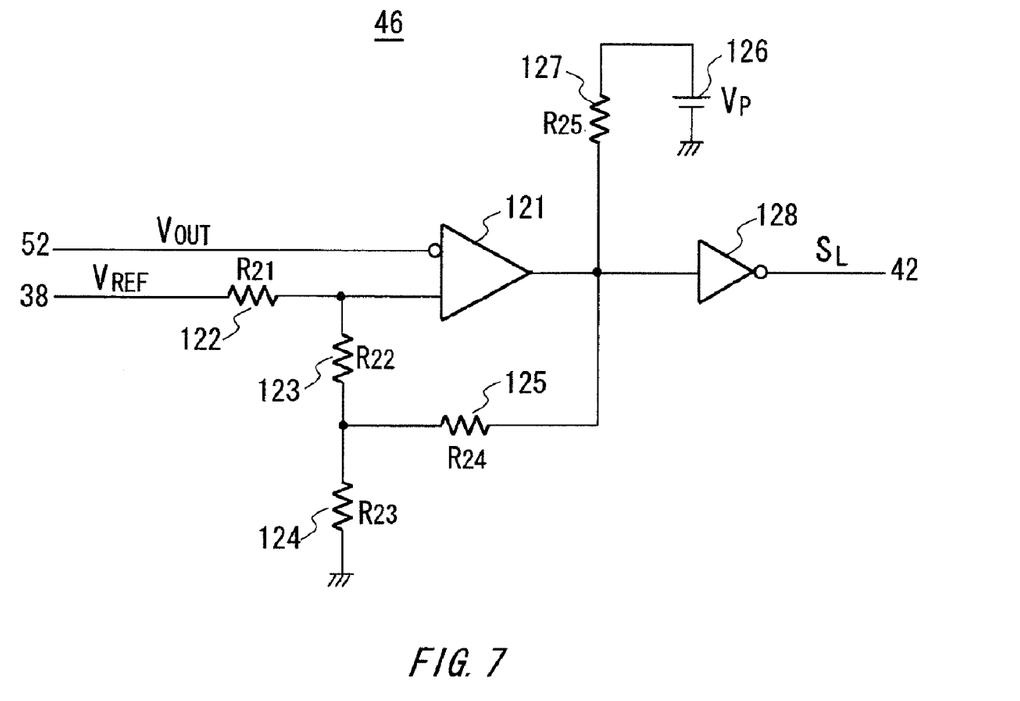
FIG. 7 shows an exemplary configuration of the voltage drop compensation control section 46 according to the present embodiment.

FIG. 7 shows an exemplary configuration of the voltage drop compensation control section 46 according to the present embodiment. The voltage drop compensation control section 46, in which a hysteresis is applied to the threshold values as shown in FIG. 4, may include a negative control comparator 121, a first negative control resistance 122, a second negative control resistance 123, a third negative control resistance 124, a fourth negative control resistance 125, a negative control power supply 126, a fifth negative control resistance 127, and an inverting circuit 128.

The output terminal of the negative control comparator 121 is open if the voltage input to the positive input terminal is greater than the voltage input to the negative input terminal, and is shorted if the voltage input to the positive input terminal is less than or equal to the voltage input to the negative input terminal. The negative input terminal of the negative control comparator 121 is connected to the junction 52 and receives the output voltage $V_{OUT}$.

The first negative control resistance 122 is provided between the output terminal of the low pass filter 38 and the positive input terminal of the negative control comparator 121. The second negative control resistance 123 and the third negative control resistance 124 are provided in series between the positive input terminal of the negative control comparator 121 and the ground, with the second negative control resistance 123 being nearer the negative control comparator 121 and the third negative control resistance 124 being nearer the ground. The fourth negative control resistance 125 is provided between (i) the output terminal of the negative control comparator 121 and (ii) the connection point between the second negative control resistance 123 and the third negative control resistance 124.

The negative input terminal of the negative control power supply 126 is connected to the ground. The fifth negative control resistance 127 is provided between the output terminal of the negative control comparator 121 and the positive terminal of the negative control power supply 126. The inverting circuit 128 receives the voltage of the output terminal of the negative control comparator 121 and outputs the first load control signal $S_L$ obtained by inverting the logic of the received voltage.

With the voltage drop compensation control section 46 having the configuration described above, the first load control signal $S_L$ can be switched from high to low when the output voltage $V_{OUT}$ decreases to become less than the lower reference voltage $V_{ref1}$ while the first load control signal $S_L$ is in the high state, i.e. while the voltage drop compensation load section 42 is turned on. Furthermore, the first load control signal $S_L$ can be switched from low to high when the output voltage $V_{OUT}$ increases to become greater than or equal to the third reference voltage $V_{ref3}$, which is greater than the lower reference voltage $V_{ref1}$, while the voltage drop compensation load section 42 is in the low state, i.e. while the voltage drop compensation load section 42 is turned off.

More specifically, if the voltage generated at the negative control power supply 126 is $V_P$, the resistance value of the first negative control resistance 122 is $R_{21}$, the resistance value of the second negative control resistance 123 is $R_{22}$, the resistance value of the third negative control resistance 124 is $R_{23}$, the resistance value of the fourth negative control resistance 125 is $R_{24}$, and the resistance value of the fifth negative control resistance 127 is $R_{25}$, the voltage drop compensation control section 46 can compare the output voltage $V_{OUT}$ to the lower reference voltage $V_{ref1}$ and the third reference voltage $V_{ref3}$ shown below in Expression 2 and Expression 3.

$$V_{REF1} = \{(R_{22} + ((R_{23} \times R_{24})/(R_{23} + R_{24})))/(R_{21} + R_{22} + ((R_{23} \times R_{24})/(R_{23} + R_{24})))\} \times V_{REF} \quad \text{Expression 2}$$

$$V_{REF3} = \{(R_{22} + ((R_{23} \times (R_{24} + R_{25}))/(R_{23} + R_{24} + R_{25})))/ (R_{21} + R_{22} + ((R_{23} \times (R_{24} + R_{25}))/(R_{23} + R_{24} + R_{25})))\} \times V_{REF} + \{(((R_{21} + R_{22}) \times R_{23})/(R_{21} + R_{22} + R_{23}))/ (((((R_{21} + R_{22}) \times R_{23})/(R_{21} + R_{22} + R_{23})) + R_{24} + R_{25}) \times (R_{21}/(R_{21} + R_{22})))\} \times V_P \quad \text{Expression 3}$$

Figure 8:
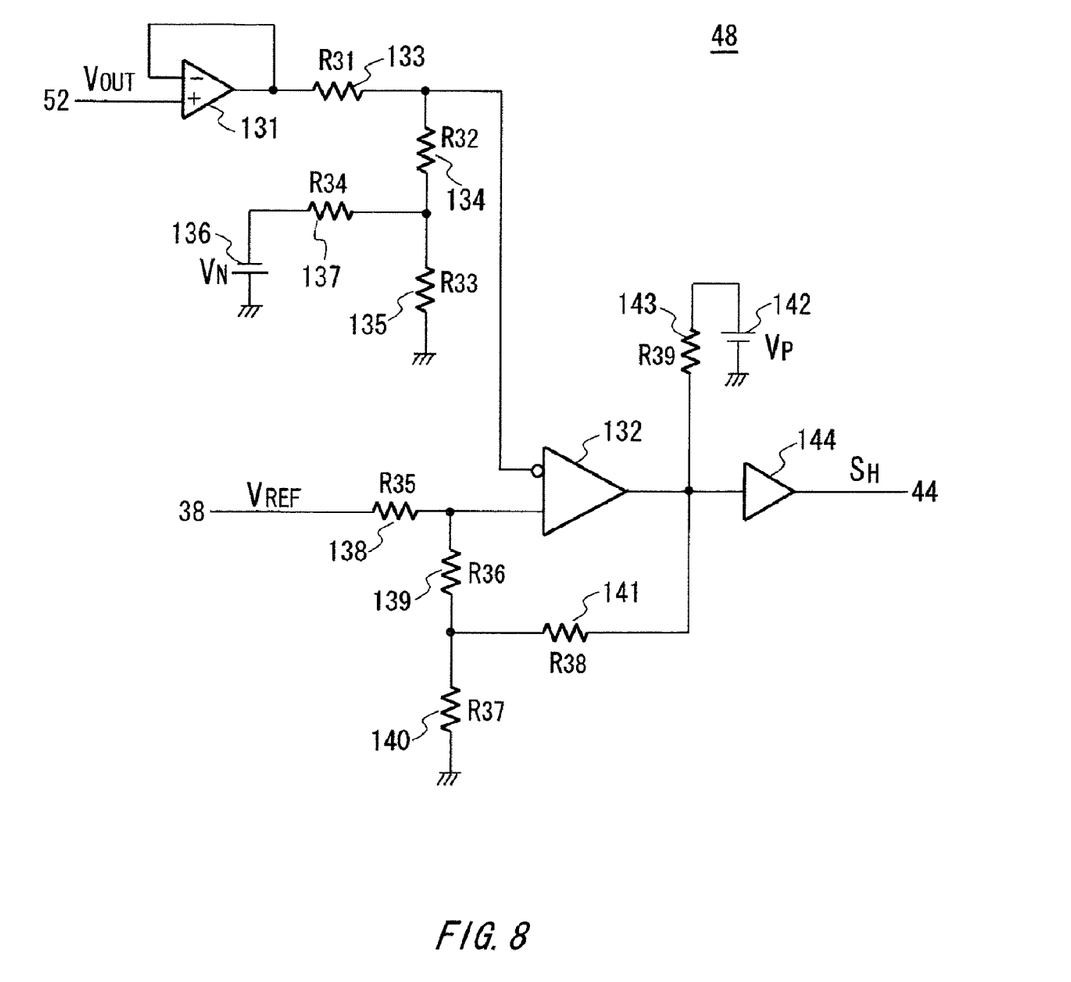
FIG. 8 shows an exemplary configuration of the excess voltage restricting control section 48 according to the present embodiment.

FIG. 8 shows an exemplary configuration of the excess voltage restricting control section 48 according to the present embodiment. The excess voltage restricting control section 48, in which a hysteresis is applied to the threshold values as shown in FIG. 5, may include a voltage follower circuit 131, a positive control comparator 132, a first positive control resistance 133, a second positive control resistance 134, a third positive control resistance 135, a positive control negative power supply 136, a fourth positive control resistance 137, a fifth positive control resistance 138, a sixth positive control resistance 139, a seventh positive control resistance 140, an eighth positive control resistance 141, a positive control positive power supply 142, a ninth positive control resistance 143, and a buffer circuit 144.

The voltage follower circuit 131 has a high input impedance and a low output impedance. The voltage follower circuit 131 receives a voltage value at the input terminal and outputs this voltage value from the output terminal. The input terminal of the voltage follower circuit 131 is connected to the junction 52 and receives the output voltage $V_{OUT}$.

The output terminal of the positive control comparator 132 is open if the voltage input to the positive input terminal is greater than the voltage input to the negative input terminal, and is shorted if the voltage input to the positive input terminal is less than or equal to the voltage input to the negative input terminal.

The first positive control resistance 133 is provided between the output terminal of the voltage follower circuit 131 and the negative input terminal of the positive control comparator 132. The second positive control resistance 134 and the third positive control resistance 135 are provided in series between the negative input terminal of the positive control comparator 132 and the ground, with the second positive control resistance 134 being nearer the positive control comparator 132 and the third positive control resistance 135 being nearer the ground. The positive terminal of the positive control negative power supply 136 is connected to the ground. The fourth positive control resistance 137 is provided between (i) the negative terminal of the positive control negative power supply 136 and (ii) the connection point between the second positive control resistance 134 and the third positive control resistance 135.

The fifth positive control resistance 138 is provided between the output terminal of the low pass filter 38 and the positive input terminal of the positive control comparator 132. The sixth positive control resistance 139 and the seventh positive control resistance 140 are provided in series between the positive input terminal of the positive control comparator 132 and the ground, with the sixth positive control resistance 139 being nearer the positive control comparator 132 and the seventh positive control resistance 140 being nearer the ground. The eighth positive control resistance 141 is provided between (i) the output terminal of the positive control comparator 132 and (ii) the connection point between the sixth positive control resistance 139 and the seventh positive control resistance 140.

The negative input terminal of the positive control positive power supply 142 is connected to the ground. The ninth positive control resistance 143 is provided between the output terminal of the positive control comparator 132 and the positive terminal of the positive control positive power supply 142. The buffer circuit 144 receives the voltage of the output terminal of the positive control comparator 132 and outputs the second load control signal $S_H$ having the logic of the received voltage.

With the excess voltage restricting control section 48 having the configuration described above, the second load control signal $S_H$ can be switched from low to high when the output voltage $V_{OUT}$ increases to become greater than or equal to the third reference voltage $V_{ref3}$ while the second load control signal $S_H$ is in the low state, i.e. while the excess voltage restricting load section 44 is turned off. Furthermore, the second load control signal $S_H$ can be switched from high to low when the output voltage $V_{OUT}$ decreases to become less than the fourth reference voltage $V_{ref4}$, which is less than the upper reference voltage $V_{re1}$, while the excess voltage restricting load section 44 is in the high state, i.e. while the excess voltage restricting load section 44 is turned on.

More specifically, if the voltage generated by the positive control negative power supply 136 is $-V_N$, the voltage generated by the positive control positive power supply 142 is $V_P$, the resistance value of the first positive control resistance 133 is $R_{31}$, the resistance value of the second positive control resistance 134 is $R_{32}$, the resistance value of the third positive control resistance 135 is $R_{23}$, the resistance value of the fourth positive control resistance 137 is $R_{34}$, the resistance value of the fifth positive control resistance 138 is $R_{35}$, the resistance value of the sixth positive control resistance 139 is $R_{36}$, the resistance value of the seventh positive control resistance 140 is $R_{37}$, the resistance value of the eighth positive control resistance 141 is $R_{38}$, and the resistance value of the ninth positive control resistance 143 is $R_{39}$, the excess voltage restricting control section 48 can compare the output voltage $V_{OUT}$ to the upper reference voltage $V_{ref2}$ and the fourth reference voltage $V_{ref4}$ shown below in Expression 5 and Expression 6.

$$V_{REF2}=\{(R_{36}+((R_{37}\times(R_{38}+R_{39}))/(R_{37}+R_{38}+R_{39})))/ \\ (R_{35}+R_{36}+((R_{37}\times(R_{38}+R_{39}))/(R_{37}+R_{38}+R_{39}))\}\times \\ V_{REF}+\{(((R_{35}+R_{36})\times R_{37})/(R_{35}+R_{36}+R_{37}))/ \\ (((((R_{35}+R_{36})\times R_{37})/(R_{35}+R_{36}+R_{37}))+R_{38}+R_{39})\times \\ (R_{35}/(R_{35}+R_{36}))\}\times V_P+\{(((R_{31}+R_{32})\times R_{33})/(R_{34}+ \\ ((R_{31}+R_{32})\times R_{33})))/(R_{31}+R_{32}+R_{33})\}\times V_N \quad \text{Expression 4}$$

$$V_{REF4}=\{(R_{36}+((R_{37}\times R_{38})/(R_{37}+R_{38})))/(R_{35}+R_{36}+ \\ ((R_{37}\times R_{38})/(R_{37}+R_{38}))\}\times V_{REF}+\{(((R_{31}+R_{32})\times \\ R_{33})/(R_{34}+((R_{31}+R_{32})\times R_{33})))/(R_{31}+R_{32}+R_{33})\}\times \\ V_N \quad \text{Expression 5}$$

Figure 9:
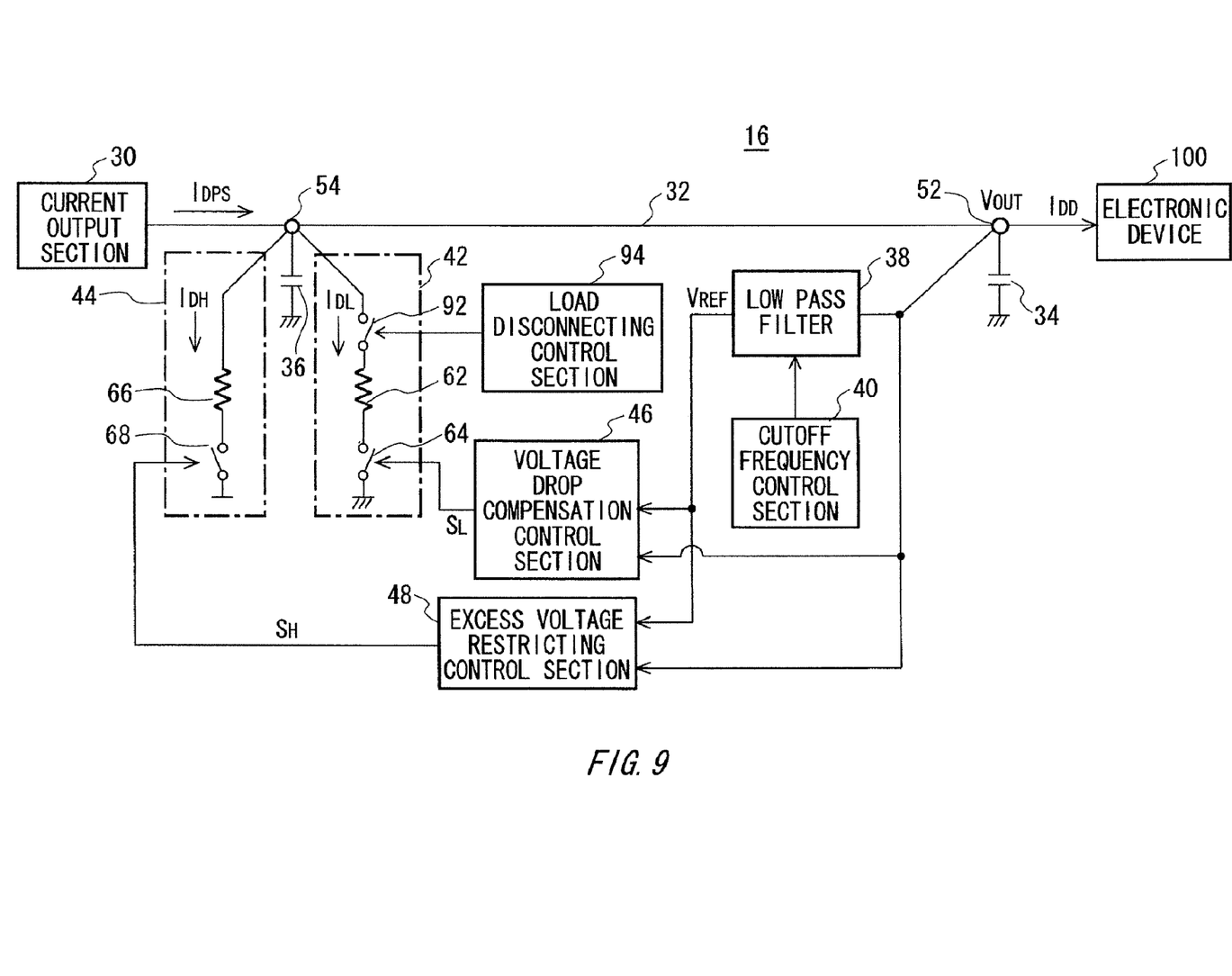
FIG. 9 shows an exemplary configuration of the power supply apparatus 16 according to a modification of the present embodiment, together with the electronic device 100.

FIG. 9 shows an exemplary configuration of the power supply apparatus 16 according to a modification of the present embodiment, together with the electronic device 100. The power supply apparatus 16 of the present modification has components with substantially the same function and configuration as the components having the same reference numerals shown in FIG. 2, and therefore only differing points are described below.

The voltage drop compensation load section 42 in the power supply apparatus 16 of the present modification further includes a load selecting switch 92. The power supply apparatus 16 of the present modification further includes a load disconnection control section 94. The load selecting switch 92 switches whether the voltage drop compensation load section 42 is electrically connected between the current output section 30 and the ground. If a first test and a second test using different reference values for the output current from the current output section 30 are executed sequentially, the load disconnection control section 94 controls the switching of the load selecting switch 92 such that the voltage drop compensation load section 42 is electrically disconnected from between the current output section 30 and the ground, thereby changing the reference value of the output current.

In this way, when switching from the first test to the second test causes the current consumed by the electronic device 100 to increase, the power supply apparatus 16 can more quickly supply the necessary power supply current $I_{DD}$ to the electronic device 100. Accordingly, the test apparatus 10 can begin the second test more quickly.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above, the embodiments of the present invention can supply the electronic device with a stabilized power supply voltage.

What is claimed is:

1. A power supply apparatus that supplies a power supply current to an electronic device, comprising:

a current output section that outputs an output current that includes the power supply current;

a low pass filter that receives an output voltage of the current output section and allows a low frequency component with a frequency lower than a preset cutoff frequency to pass through;

an excess voltage restricting load section that is connected between the current output section and a ground, in parallel with the electronic device, and that consumes an excess voltage restricting current, which is at least a portion of the output current from the current output section, when a load is turned on and stops the consumption of the excess voltage restricting current when the load is turned off; and an excess voltage restricting load control section that keeps the excess voltage restricting load section turned off when the output voltage of the current output section is less than an upper reference voltage, which is obtained by adding together a voltage output by the low pass filter and a preset upper offset voltage, and that turns on the excess voltage restricting load section when the output voltage becomes greater than or equal to the upper reference voltage.

2. The power supply apparatus according to claim 1, further comprising:

a voltage drop compensation load section that is connected between the current output section and the ground, in parallel with the electronic device and the excess voltage restricting load section, and that consumes a voltage drop compensation current, which is at least a portion of the output current from the current output section, when the load is turned on and stops the consumption of the voltage drop compensation current when the load is turned off; and a voltage drop compensation control section that keeps the voltage drop compensation load section turned on when the output voltage of the current output section is greater than or equal to a lower reference voltage, which is obtained by subtracting a preset lower offset voltage from the voltage output by the low pass filter, and that turns off the voltage drop compensation load section when the output voltage becomes less than the lower reference voltage.

3. The power supply apparatus according to claim 2, further comprising:

a power supply line that provides a connection between an output of the current output section and a power supply terminal of the power supply apparatus connected to a power supply input terminal of the electronic device; and a power supply-side capacitor that is connected between (i) a branching point between the current output section and the power supply terminal and (ii) the ground, wherein the voltage drop compensation load section and the excess voltage restricting load section are connected between (1) wiring between the branching point and the power supply-side capacitor and (2) the ground, and cause the voltage drop compensation current and the excess voltage restricting current to flow to the ground when the load is turned on.

4. The power supply apparatus according to claim 3, further comprising a cutoff frequency control section that, when a reference value of the output current from the current output section is changed, sets the cutoff frequency of the low pass filter to be higher, relative to the cutoff frequency of the low pass filter after the output current reaches a new reference value, until the output current of the current output section reaches the new reference value.

5. The power supply apparatus according to claim 3, further comprising a load disconnection control section that, when a reference value of the output current from the current output section is changed, electrically disconnects the voltage drop compensation load section from between the current output section and the ground until the output current of the current output section reaches a new reference value.

6. The power supply apparatus according to claim 3, wherein
the voltage drop compensation control section keeps the voltage drop compensation load section turned off until the output voltage becomes greater than or equal to a third reference voltage, which is obtained by subtracting a preset third offset voltage that is less than the lower offset voltage from the voltage output from the low pass filter, and turns the voltage drop compensation load section on when the output voltage becomes greater than or equal to the third reference voltage.

7. The power supply apparatus according to claim 3, wherein
the excess voltage restricting control section keeps the excess voltage restricting load section turned on until the output voltage becomes less than a fourth reference voltage, which is obtained by adding a preset fourth offset voltage that is less than the upper offset voltage to the voltage output from the low pass filter, and turns the excess voltage restricting load section off when the output voltage becomes less than the fourth reference voltage.

8. A test apparatus that tests an electronic device, comprising:
a current output section that outputs an output current that includes a power supply current supplied to the electronic device;
a low pass filter that receives an output voltage of the current output section and allows a low frequency component with a frequency lower than a preset cutoff frequency to pass through;
an excess voltage restricting load section that is connected between the current output section and a ground, in parallel with the electronic device, and that consumes an excess voltage restricting current, which is at least a portion of the output current from the current output section, when a load is turned on and stops the consumption of the excess voltage restricting current when the load is turned off;
an excess voltage restricting control section that keeps the excess voltage restricting load section turned off when the output voltage of the current output section is less than an upper reference voltage, which is obtained by adding together a voltage output by the low pass filter and a preset upper offset voltage, and that turns on the excess voltage restricting load section when the output voltage is greater than or equal to the upper reference voltage;
a current measuring section that measures the power supply current supplied to the electronic device; and
a judging section that judges whether the electronic device is defective based on a result of the measurement by the current measuring section.

9. The test apparatus according to claim 8, further comprising:
a voltage drop compensation load section that is connected between the current output section and the ground, in parallel with the electronic device and the excess voltage restricting load section, and that consumes a voltage drop compensation current, which is at least a portion of the output current from the current output section, when the load is turned on and stops the consumption of the voltage drop compensation current when the load is turned off; and
a voltage drop compensation control section that keeps the voltage drop compensation load section turned on when the output voltage of the current output section is greater than or equal to a lower reference voltage, which is obtained by subtracting a preset lower offset voltage from the voltage output by the low pass filter, and that turns off the voltage drop compensation load section when the output voltage is less than the lower reference voltage.

10. The power supply apparatus according to claim 8, further comprising:
a power supply line that provides a connection between an output of the current output section and a power supply input terminal of the electronic device;
a device-side capacitor that is connected between (i) a junction between the output of the current output section and the power supply input terminal and (ii) the ground, in parallel with the electronic device; and
a power supply-side capacitor that is connected between (i) the ground and (ii) a branching point between (1) the junction between the device-side capacitor and the power supply line and (2) the output of the current output section, wherein
the voltage drop compensation load section and the excess voltage restricting load section are connected between (i) wiring between the branching point and the power supply-side capacitor and (ii) the ground, and cause the voltage drop compensation current and the excess voltage restricting current to flow to the ground when the load is turned on.

11. The test apparatus according to claim 10, further comprising a load disconnection control section that, when a first test and a second test are sequentially performed using different reference values for the output current of the current output section, changes the reference value of the output current by electrically disconnecting the voltage drop compensation load section from between the current output section and the ground.

12. A stabilizing apparatus equipped in a current output apparatus that supplies an output current to an electronic device as a power supply current, comprising:
a low pass filter that receives an output voltage of the current output apparatus and allows a low frequency component with a frequency lower than a preset cutoff frequency to pass through;
an excess voltage restricting load section that is connected between the current output apparatus and a ground, in parallel with the electronic device, and that consumes an excess voltage restricting current, which is at least a portion of the output current from the current output apparatus, when a load is turned on and stops the consumption of the excess voltage restricting current when the load is turned off; and an excess voltage restricting control section that keeps the excess voltage restricting load section turned off when the output voltage of the current output apparatus is less than an upper reference voltage, which is obtained by adding together a voltage output by the low pass filter and a preset upper offset voltage, and that turns on the excess voltage restricting load section when the output voltage becomes greater than or equal to the upper reference voltage.

13. The stabilizing apparatus according to claim 12, further comprising:

a voltage drop compensation load section that is connected between the current output apparatus and the ground, in parallel with the electronic device and the excess voltage restricting load section, and that consumes a voltage drop compensation current, which is at least a portion of the output current from the current output apparatus, when the load is turned on and stops the consumption of the voltage drop compensation current when the load is turned off; and a voltage drop compensation control section that keeps the voltage drop compensation load section turned on when the output voltage of the current output apparatus is greater than or equal to a lower reference voltage, which is obtained by subtracting a preset lower offset voltage from the voltage output by the low pass filter, and that turns off the voltage drop compensation load section when the output voltage is less than the lower reference voltage.

* * * * *